(12) United States Patent
Liu et al.

(10) Patent No.: US 7,955,952 B2
(45) Date of Patent: Jun. 7, 2011

(54) CRACKSTOP STRUCTURES AND METHODS OF MAKING SAME

(75) Inventors: Xiao Hu Liu, Briarcliff Manor, NY (US); Chih-Chao Yang, Glenmont, NY (US); Haining Sam Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 431 days.

(21) Appl. No.: 12/174,994

(22) Filed: Jul. 17, 2008

(65) Prior Publication Data

US 2010/0013043 A1  Jan. 21, 2010

(51) Int. Cl.
*H01L 29/00* (2006.01)
*H01L 21/00* (2006.01)

(52) U.S. Cl. . 438/462; 257/618; 257/620; 257/E21.523; 257/E21.532; 438/113; 438/460; 438/461

(58) Field of Classification Search .................. 257/618, 257/620, E21.523, E21.532; 438/113, 460, 438/461, 462
See application file for complete search history.

(56) References Cited

U.S. PATENT DOCUMENTS

| | | | | |
|---|---|---|---|---|
| 5,665,655 A | * | 9/1997 | White | 438/584 |
| 5,834,829 A | * | 11/1998 | Dinkel et al. | 257/620 |
| 6,022,791 A | * | 2/2000 | Cook et al. | 438/458 |
| 6,271,578 B1 | * | 8/2001 | Mitwalsky et al. | 257/620 |
| 2007/0102792 A1 | * | 5/2007 | Wu | 257/620 |
| 2007/0194409 A1 | * | 8/2007 | Wang et al. | 257/620 |
| 2007/0205481 A1 | | 9/2007 | Ishida | |
| 2007/0264035 A1 | | 11/2007 | Fushimi et al. | |
| 2008/0157285 A1 | * | 7/2008 | Tokitoh | 257/620 |

* cited by examiner

*Primary Examiner* — Eugene Lee
*Assistant Examiner* — Peniel M Gumedzoe
(74) *Attorney, Agent, or Firm* — Schmeiser, Olsen & Watts; Ian D. MacKinnon (57) ABSTRACT

An integrated circuit chip and a method of fabricating an integrated circuit chip. The integrated circuit chip includes: a continuous first stress ring proximate to a perimeter of the integrated circuit chip, respective edges of the first stress ring parallel to respective edges of the integrated circuit chip; a continuous second stress ring between the first stress ring and the perimeter of the integrated circuit chip, respective edges the second stress ring parallel to respective edges of the integrated circuit chip, the first and second stress rings having opposite internal stresses; a continuous gap between the first stress ring and the second stress ring; and a set of wiring levels from a first wiring level to a last wiring level on the substrate.

20 Claims, 7 Drawing Sheets

CRACKSTOP STRUCTURES AND METHODS OF MAKING SAME

FIELD OF THE INVENTION

The present invention relates to the field of semiconductor devices; more specifically, it relates to crackstops and methods of making crackstops for integrated circuit chips.

BACKGROUND OF THE INVENTION

Crackstops are structures fabricated along the perimeter of integrated circuit chips to prevent delamination of the various layers of the integrated circuit chip and other edge damage during singulation (otherwise known as dicing) of individual integrated circuit chips from a wafer on which multiple integrated circuit chips have been fabricated. The inventors have noticed the protection provided by conventional crackstops has become less adequate as the dimensions of integrated circuit features has decreased and with the increasing use of low dielectric insulating materials.

SUMMARY OF THE INVENTION

A first aspect of an embodiment of the present invention is a method, comprising: (a) for each integrated circuit chip of an array of integrated circuit chips on a semiconductor substrate, forming proximate to respective perimeters of each integrated circuit chip respective continuous first stress rings, respective edges of respective first stress rings parallel to respective edges of the integrated circuit chips; after (a), (b) for each integrated circuit chip of the array of integrated circuit chips, forming respective continuous second stress rings between respective first stress rings and respective perimeters of the integrated circuit chips, respective edges of respective second stress rings parallel to respective edges of the integrated circuit chips, the first and second stress rings having opposite internal stresses; after (b), (c) for each integrated circuit chip of the array of integrated circuit chips, forming respective continuous gaps between respective first stress rings and respective second stress rings; after (c), (d) for each integrated circuit chip of the array of integrated circuit chips, forming a respective set of wiring levels from a first wiring level to a last wiring level on the substrate; and after (d), (e) dicing the array of integrated circuit chips into individual integrated circuit chips.

A second aspect of an embodiment of the present invention is an integrated circuit chip, comprising: a continuous first stress ring proximate to a perimeter of the integrated circuit chip, respective edges of the first stress ring parallel to respective edges of the integrated circuit chip; a continuous second stress ring between the first stress ring and the perimeter of the integrated circuit chip, respective edges the second stress ring parallel to respective edges of the integrated circuit chip, the first and second stress rings having opposite internal stresses; a continuous gap between the first stress ring and the second stress ring; and a set of wiring levels from a first wiring level to a last wiring level on the substrate.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
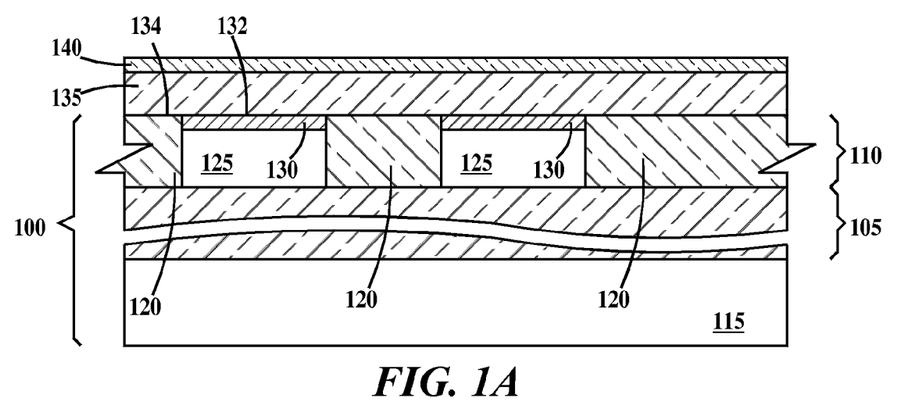
FIGS. 1A through 1F are cross-sections illustrating fabrication of a crackstop structure according to a first embodiment of the present invention.

FIGS. 1A through 1F are cross-sections illustrating fabrication of a crackstop structure according to a first embodiment of the present invention. In FIG. 1A, semiconductor substrate 100 includes a buried oxide (BOX) layer 105 between a semiconductor layer 110 and a supporting substrate 115. In one example, semiconductor layer 110 and support substrate comprise silicon. As illustrated, semiconductor substrate 100 is an example of a silicon-on-insulator (SOI) substrate. Other semiconductor substrates, such as bulk silicon substrates and silicon-germanium substrates may be substituted for SOI substrates. Regions of shallow trench isolation (STI) 120 have been formed in silicon layer 100 simultaneously forming silicon islands 125 which are completely surrounded along their perimeters by STI 120. Contact layers 130 are formed in regions of silicon islands 125 adjacent to top surfaces 132 of the silicon islands. In one example, contact layers 130 comprise a metal silicide. Formed on a top surface 134 of substrate 100 is a first stressed layer 135. Formed on top of first stressed layer 135 is a hard mask layer 140. In one example, first stressed layer 135 is silicon nitride. In one example first stressed layer 135 is in internal compressive stress (e.g., about −2.0 GPa). In one example, first stressed layer 135 is between about 50 nm and about 200 nm thick. In one example, hardmask layer 140 is a low temperature oxide (LTO). In one example, first hardmask layer 140 is between about 10 nm and about 40 nm thick.

Figure 1B:
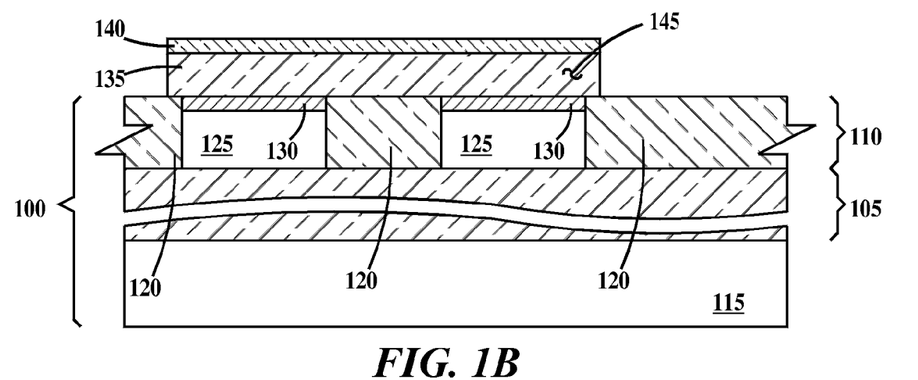

In FIG. 1B, first stressed layer 135 and hardmask layer 140 have been photolithographically patterned and etched to form a first stress ring 145 that is internal compressive stress. The reason for the nomenclature stress ring will be made apparent infra. Stress ring 145 covers silicon islands 125 and regions of STI 120 between the silicon islands. Stress ring 145 overlaps regions of STI adjacent to the perimeters of silicon islands 125.

Figure 1C:
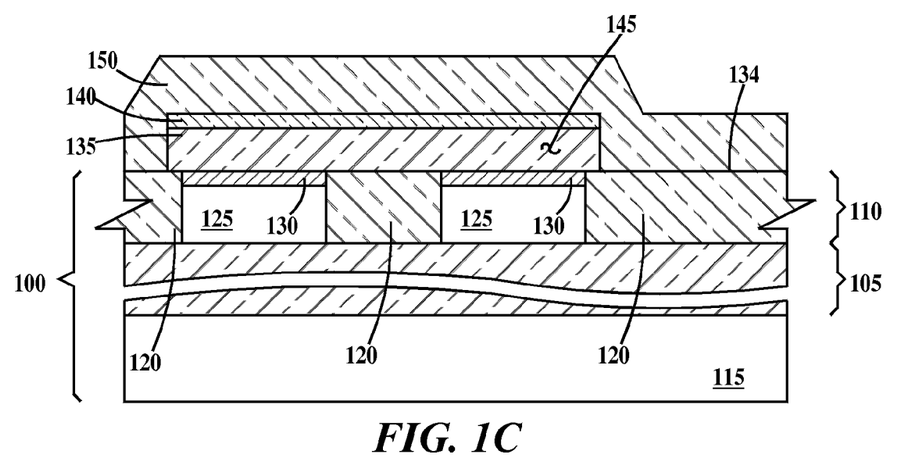

In FIG. 1C, a second stressed layer 150 is formed on first stress ring 145 and on top surface 134 of substrate 100 where the substrate is not covered by first stress ring 145. In one example, first stressed layer 135 is silicon nitride. In one example second stressed layer 150 is in internal tensile stress (e.g., about 1.5 GPa). In one example, second stressed layer 150 is between about 50 nm and about 200 nm thick.

Figure 1D:
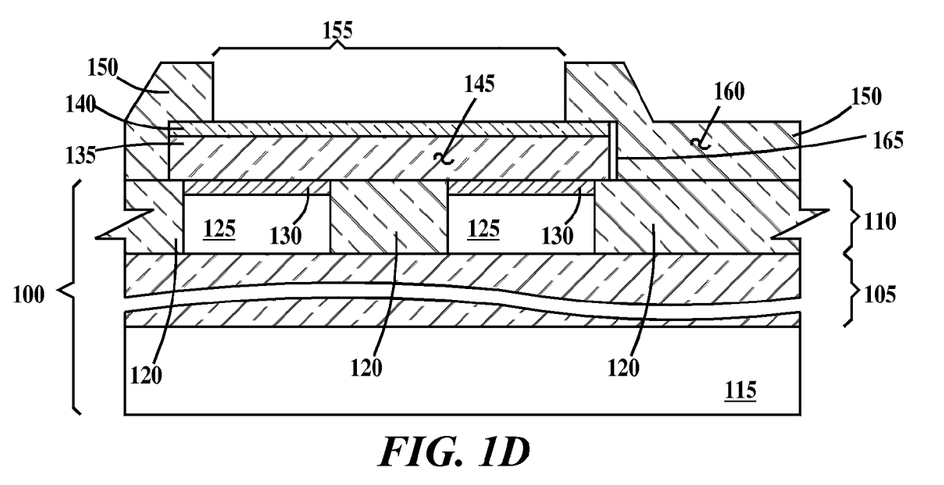

In FIG. 1D, second stress layer 150 is photolithographically patterned and etched to form a trench 155 in the second stress layer and a second stress ring 160 in internal tensile stress. Hardmask layer 140 prevents etching of first stress ring 145 during the etching of second stressed layer 150. Because first stress ring 145 and second stress ring 160 are under opposite stresses, a high-stress seam 165 (not shown to scale) is formed in the interface between the first and second stress rings. Seam 165 will act as a crackstop as described infra. While first stress ring 145 has been described as being in compressive stress and second stress ring 160 has been described as being in tensile stress, the stresses may be reversed so first stress ring 145 is in tensile stress and second stress ring 160 is in compressive stress. In the first embodiment of the present invention a gap is defined as a seam between adjacent surfaces. The adjacent surfaces may be spaced slightly apart or in physical contact or regions of the interface may be in contact and regions may be spaced slightly apart.

Figure 1E:
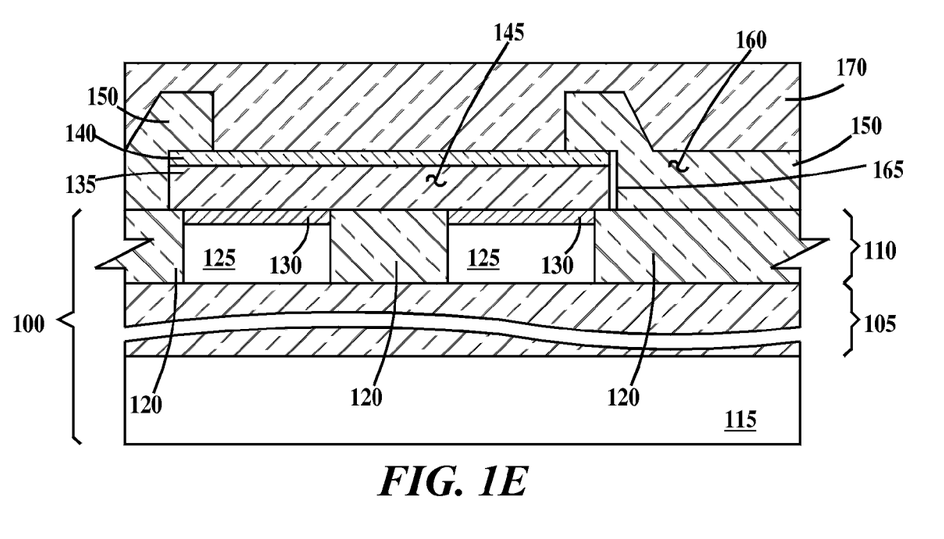

In FIG. 1E, a first dielectric layer 170 is formed on second stress layer 150 and on hardmask layer 140 where the hardmask layer is not covered by the second stress layer. In one example first dielectric layer 170 comprises a high-density plasma (HDP) oxide. An HDP oxide is an oxide formed in a high-density plasma chemical vapor (CVD) deposition process and is well know in the industry. In one example, HDP oxide is formed from mixture of oxygen and silane at a pressure of about 2 mTorr to about 10 mTorr in a plasma having an electron density of about 1 E12/cm$^2$. In one example first dielectric layer 170 is between about 200 nm and about 300 nm thick.

Figure 1F:
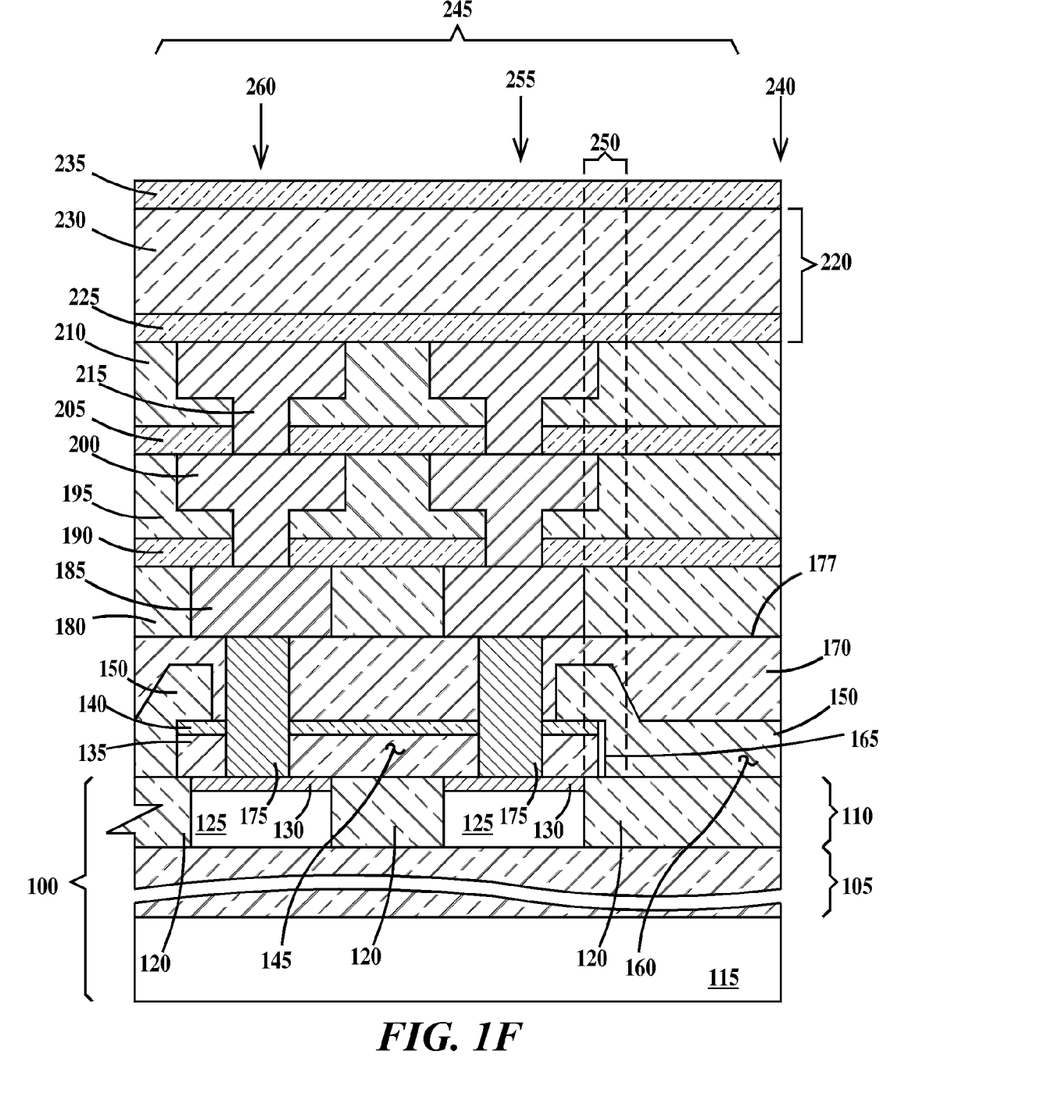

In FIG. 1F, contacts 175 are formed through first dielectric layer 170 and hardmask layer 140 and first stressed layer 135 of first stress ring 145. Contacts 175 extend from a top surface 177 of first dielectric layer 170 to contact layers 130. Top surfaces of contacts 150 are essentially coplanar with the top surface of first dielectric layer 170. First dielectric layer 175 and contacts 170 comprise a contact level of an integrated circuit chip, which may also be considered a wiring level. Contacts 175 extend in concentric rings proximate to a perimeter of the integrated circuit chip that will be formed after a dicing operation.

Also in FIG. 1F, a second dielectric layer 180 is formed on a top surface of first dielectric layer 170 and contacts 175. Metal wires 185 are formed through second dielectric layer 180. Wires 180 extend from a top surface second dielectric layer 180 to top surfaces of contacts 150. The top surfaces of wires 180 are essentially coplanar with the top surface of second dielectric layer 185. In one example, second dielectric layer 180 comprise one or more low K (dielectric constant) materials, examples of which include but are not limited to hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), and porous SiCOH. A low K dielectric material has a relative permittivity of about 2.4 or less. In one example, second dielectric layer 180 is between about 100 nm and about 200 nm thick. Second dielectric layer 180 and wires 185 comprise a first wiring level (or a second wiring level if contacts 175 are counted as wires) of the integrated circuit chip. Wires 185 extend in concentric rings proximate to a perimeter of the integrated circuit chip.

A third dielectric layer 190 is formed on a top surface of second dielectric layer 185 and on top surfaces of wires 185. In one example, third dielectric layer 190 comprises silicon nitride or silicon carbide. In one example, third dielectric layer 190 is between about 25 and 75 nm thick. A fourth dielectric layer 195 is formed on a top surface of third dielectric layer 190. In one example, fourth dielectric layer 195 comprises one or more of the low K dielectric materials listed supra. In one example, fourth dielectric layer 195 is between about 300 nm to about 400 nm thick. Metal wires 200 are formed through third and fourth dielectric layers 190 and 195. Wires 200 extend from a top surface of fourth dielectric layer 195 to top surfaces of wires 185. Top surfaces of wires 200 are essentially coplanar with the top surface of fourth dielectric layer 195. Third and fourth dielectric layers 190 and 195 and wires 200 comprise a second wiring level (or a third wiring level if contacts 175 are counted as wires) of the integrated circuit chip. Wires 200 extend in concentric rings proximate to a perimeter of the integrated circuit chip.

A fifth dielectric layer 205 is formed on a top surface of fourth dielectric layer 195 and on top surfaces of wires 200. In one example, fifth dielectric layer 205 comprises silicon nitride or silicon carbide. In one example, fifth dielectric layer 205 is between about 25 and 75 nm thick. A sixth dielectric layer 210 is formed on a top surface of fifth dielectric layer 205. In one example, sixth dielectric layer 210 comprises one or more of the low K dielectric materials listed supra. In one example, sixth dielectric layer 210 is between about 300 nm to about 400 nm thick. Metal wires 215 are formed through fifth and sixth dielectric layers 205 and 210. Wires 215 extend from a top surface of sixth dielectric layer 210 to top surfaces of wires 200. Top surfaces of wires 215 are essentially coplanar with the top surface of sixth dielectric layer 210. Fifth and sixth dielectric layers 205 and 210 and wires 215 comprise a third wiring level (or a fourth wiring level if contacts 175 are counted as wires) and in this example, last wiring level of the integrated circuit chip of the integrated circuit chip. Wires 215 extend in concentric rings proximate to a perimeter of the integrated circuit chip. Additional wiring levels (not illustrated in the drawings) similar to the second and third wiring levels may be formed between the first and second wiring levels.

Also in FIG. 1F, a terminal passivation level 220 is formed on sixth dielectric layer 210. Terminal passivation level 220 comprise a first terminal dielectric layer 225 and a second terminal dielectric layer 230. Terminal pads (not shown) are formed in terminal passivation level 220 to the left of wires 215, 200, 185 and contacts 175 connected to other wires (not shown) in sixth dielectric layer 210. In one example, first terminal dielectric layer 225 comprises silicon nitride or silicon carbide. In one example, first terminal dielectric layer 225 is between about 25 and 75 nm thick. In one example, second terminal dielectric layer 230 comprises an N-doped silicon glass. A chip passivation layer 235 is formed on terminal level 215. The terminal pads (not shown) are not covered by chip passivation layer 235. Chip passivation layer 235 may comprise two or more layers. Chip passivation layer 235 may include an oxide layer, a silicon carbide layer, a polyimide layer and combination thereof.

Also in FIG. 1F, an edge 240 of a singulated chip has been formed by dicing. In one example, dicing is performed by sawing the wafer into individual chips. A peripheral region 245 of the singulated integrated circuit chip includes a crackstop 250, an outer guard ring 255 and an inner guard ring 260. Crackstop 250 includes seam 165 and regions of first and second stress rings 145 and 160 adjacent to the seam. A crack or delamination propagating from edge 240 will stop propagating when the crack or delamination hits the seam. Edge 235 is perpendicular to the top surface of substrate 100. Each of guard rings 255 and 260 includes a contact silicon island 125, a contact layer 130, a contact 175, a wire 185, a wire 200 and a wire 215.

Contacts 175 and wires 185 are single damascene contacts and wires formed by a single-damascene process. Wires 200 and 215 are dual-damascene wires formed by a dual damascene process. In one example, contacts 175 comprise tungsten. In one example, wires 185, 200 and 215 comprise a core of copper, a liner of tantalum over the copper core and a liner of tantalum nitride over the tantalum liner. The liners are formed on the sides and bottom of the trench the wire in as described infra.

A damascene process is one in which wire trenches or via openings are formed in a dielectric layer, an electrical conductor of sufficient thickness to fill the trenches is deposited on a top surface of the dielectric layer, and a chemical-mechanical-polish (CMP) process is performed to remove excess conductor and male the surface of the conductor coplanar with the surface of the dielectric layer to form damascene wires (or damascene vias). When only a trench and a wire (or a via trench and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via trench. An electrical conductor of sufficient thickness to fill the trenches and via trench is deposited on a top surface of the dielectric and a CMP process is performed to make the surface of the conductor in the trench co-planar with the surface the dielectric layer to form dual-damascene wires and dual-damascene wires having integral dual-damascene vias.

Figure 2A:
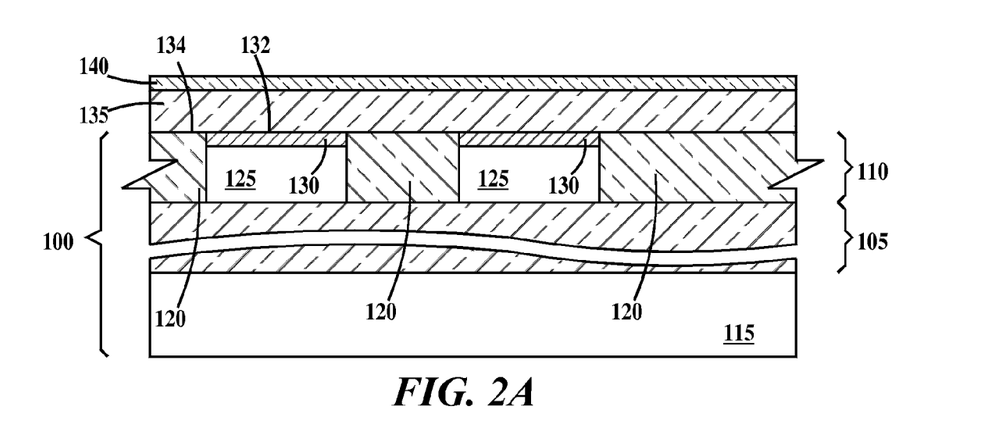
FIGS. 2A through 2F are cross-sections illustrating fabrication of a crackstop structure according to a second embodiment of the present invention.
Figure 2B:
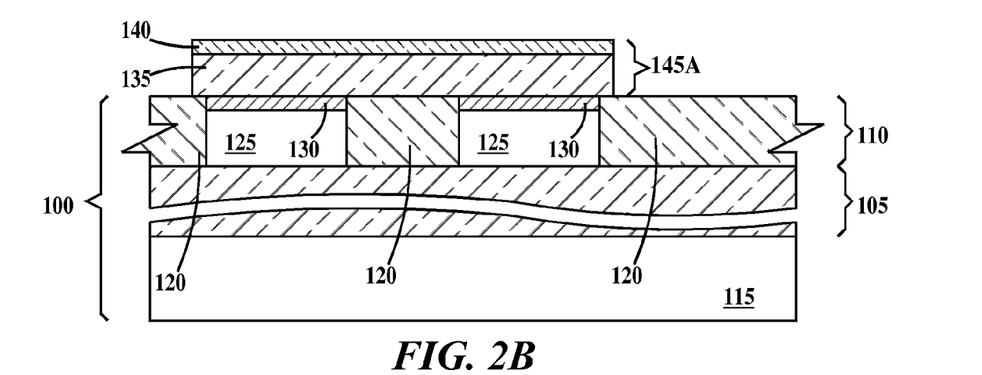
Figure 2C:
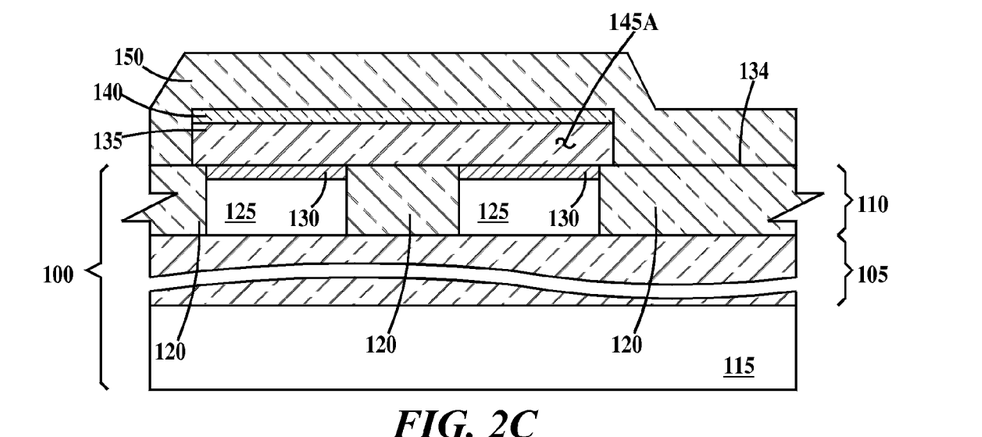
Figure 2D:
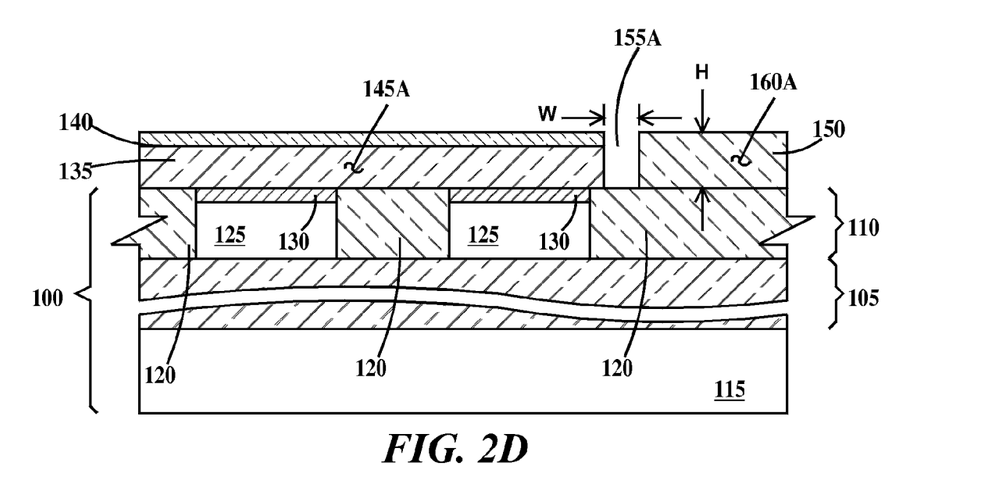
Figure 2E:
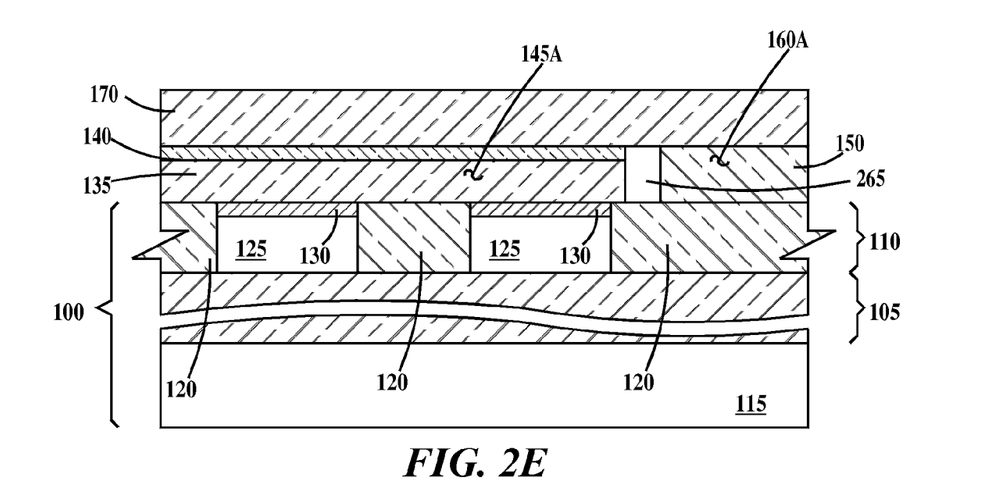
Figure 2F:
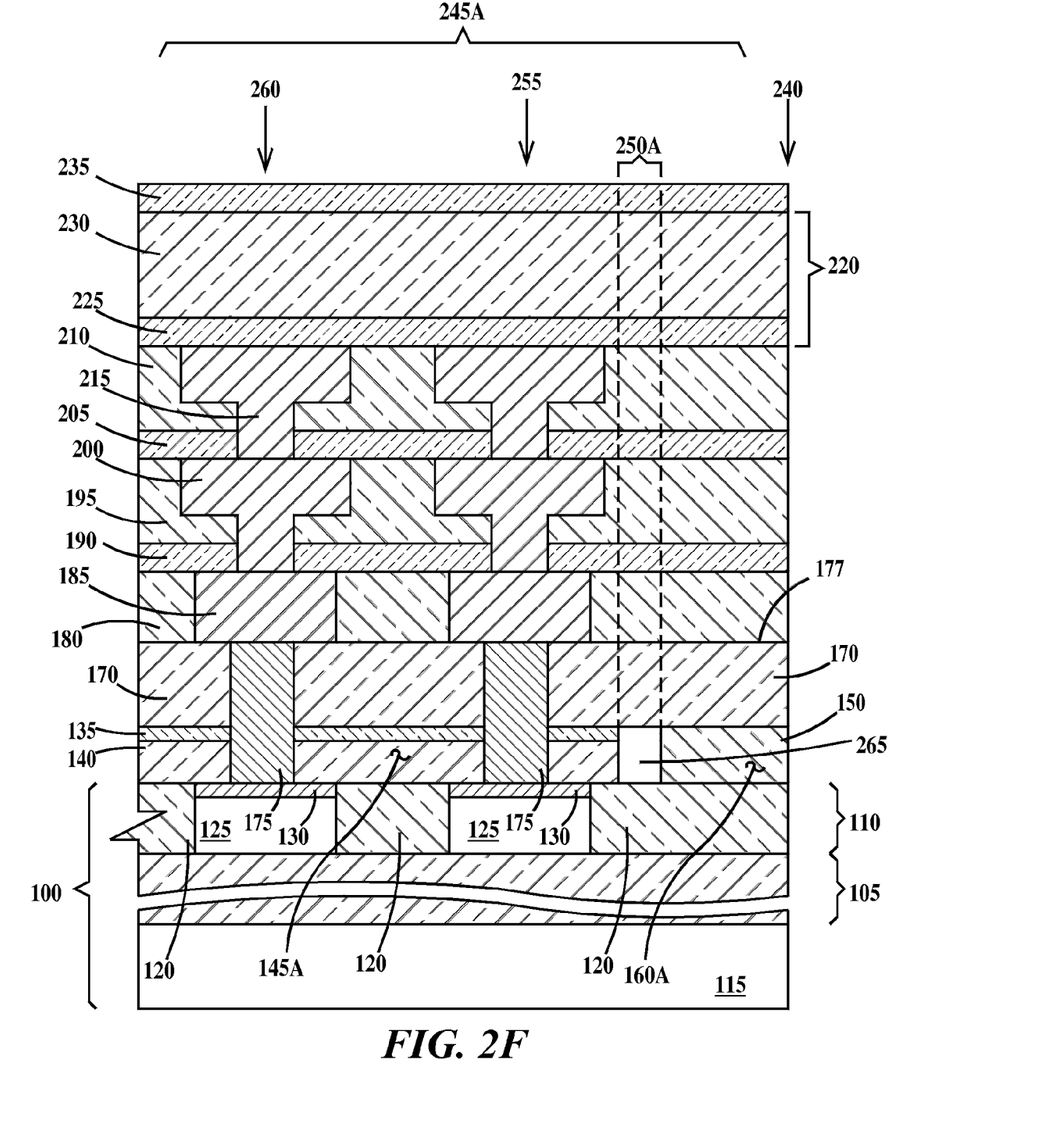

FIGS. 2A through 2F are cross-sections illustrating fabrication of a crackstop structure according to a second embodiment of the present invention. FIGS. 2A, 2B and 2C are similar respectively to FIGS. 1A, 1B and 1C except stress ring 145 of FIGS. 1B and 1C is replaced with a first stress ring 145A of FIGS. 2B and 2C, In FIG. 2D, second stress layer 150 is photolithographically patterned and etched to form a trench 155A between first stress ring 145A in compressive stress (e.g., −2.0 GPa) and a second stress ring 160A in internal tensile stress (e.g., 1.5 GPa). Hardmask layer 140 prevents etching of first stress ring 145A during the etching of second stressed layer 150A. While first stress ring 145A has been described as being in compressive stress and second stress ring 160A has been described as being in tensile stress, the stresses may be reversed so first stress ring 145A is in tensile stress and second stress ring 160A is in compressive stress. Trench 155A has a width W and a height H. In one example, the aspect ratio (H/W) of trench 155A is equal to or greater than about 2. In one example, the aspect ratio (H/W) of trench 155A is equal to or greater than about 3. In one example, trench 155A may be formed by applying a layer of photoresist to second stress layer 150 (see FIG. 1C), exposing the photoresist to actinic radiation through a patterned photomask, developing the exposed photoresist, reactive ion etching (RIE) first stress layer 150 where it its not protected by the photoresist layer and then removing the photoresist layer In FIG. 2E, first dielectric layer 170 is formed on a top surface of hardmask layer 140 and a top surface of second stress ring 160A. Because of the high aspect ratio of trench 155A (see FIG. 2D) first dielectric layer 170 does not fill or fills only partially the trench forming a void 265 in between first stress island 145A and second stress island 160A. FIG. 2F is similar to FIG. 1F, except a crackstop 250A includes a continuous ring shaped void 265. In the second embodiment of the present invention a gap is defined as a voided region between adjacent surfaces. The void need not touch the adjacent surfaces. The void may be formed in a third material between the adjacent surfaces.

Figure 3:
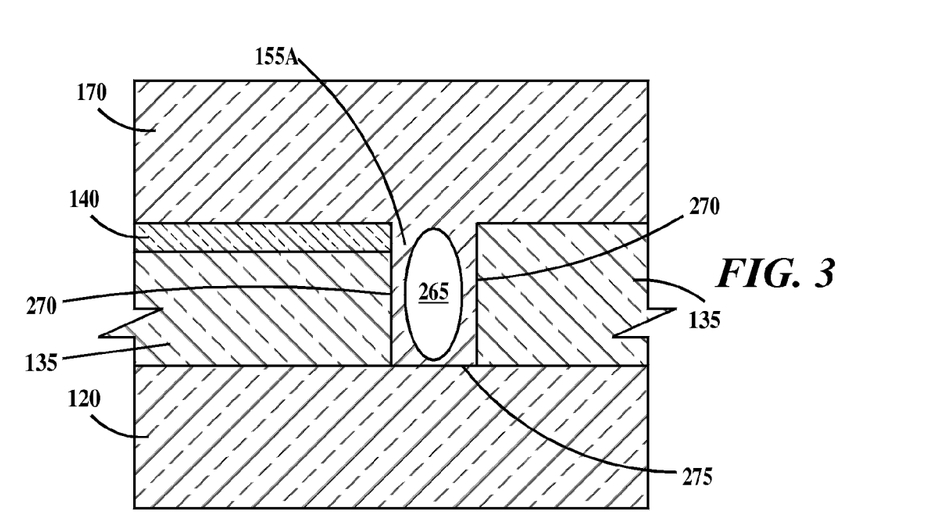
FIG. 3 is a detailed view of exemplary void formation in the crackstop structure of the second embodiment of the present invention.

FIG. 3 is a detailed view of exemplary void formation in the crackstop structure of the second embodiment of the present invention. In FIG. 3, it can be seen that the material of first dielectric layer 170 coats sidewalls 270 and bottom 275 of trench 155A but the trench is not filled in forming the void 265. In other examples, bottom surface 275 may not be completely covered by the material of first dielectric layer 170.

Figure 4:
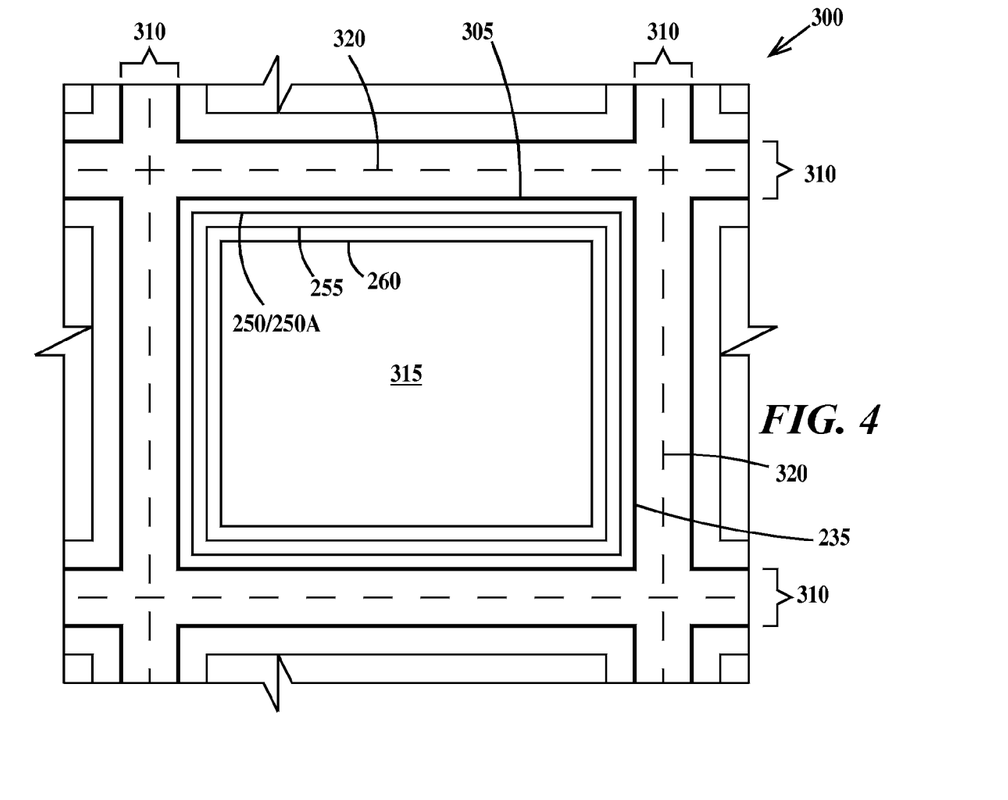
FIG. 4 is a plan view of integrated circuit chips prior to singulation according to embodiments of the present invention.

FIG. 4 is a plan view of integrated circuit chips prior to singulation according to embodiments of the present invention. In FIG. 4, a wafer 300 includes an array of un-singulated integrated circuit chips 305. Chips 315 are separated by kerf regions 310. An active region 315 of each integrated circuit chip is surrounded by crackstop 250/250A and inner and outer guard rings 255 and 260. The heavy line indicates edge 235 of chip 305 after dicing along the dashed lines 320.

Thus, the embodiments of the present invention provide a crackstop having small horizontal dimensions and suitable for use with low-K inter-level dielectric materials.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) for each integrated circuit chip of an array of integrated circuit chips on a semiconductor substrate, forming proximate to respective perimeters of each integrated circuit chip respective continuous first stress rings, respective edges of said respective first stress rings parallel to respective edges of said integrated circuit chips;
   after (a), (b) for each integrated circuit chip of said array of integrated circuit chips, forming respective continuous second stress rings between respective first stress rings and respective perimeters of said integrated circuit chips, respective edges of respective second stress rings parallel to respective edges of said integrated circuit chips, said first and second stress rings having opposite internal stresses;
   after (b), (c) for each integrated circuit chip of said array of integrated circuit chips, forming respective continuous gaps between respective first stress rings and respective second stress rings;
   after (c), (d) for each integrated circuit chip of said array of integrated circuit chips, forming a respective set of wiring levels from a first wiring level to a last wiring level on said substrate; and
   after (d), (e) dicing said array of integrated circuit chips into individual integrated circuit chips.

2. The method of claim 1, wherein:
   (a) includes forming a first stress layer on said substrate, forming a hardmask layer on said first stress layer and patterning said first stress layer and said hardmask layer into said first stress rings and corresponding and respective coextensive hardmask rings; and
   (b) includes forming a second stress layer on said substrate and on said respective hardmask rings and patterning said second stress layer into said respective second stress rings, respective second stress rings overlapping respective perimeters of respective first stress rings.

3. The method of claim 2, wherein each respective gap comprises a continuous seam along an interface between respective first stress rings and respective second stress rings.

4. The method of claim 2, wherein said first and second stress rings comprise silicon nitride and said first stress rings are in internal compressive stress and said second stress rings are in internal tensile stress.

5. The method of claim 1, wherein:
   (a) includes forming a first stress layer on said substrate, forming a hardmask layer on said first stress layer and patterning said first stress layer and said hardmask layer into said first stress rings and corresponding and respective coextensive hardmask rings;
   (b) includes forming a second stress layer on said substrate and on said hardmask rings and patterning said second stress layer into said second stress rings, respective second stress rings separated from respective first stress rings by respective continuous trenches; and
   (c) includes forming a dielectric layer over said first and second stress rings and said trenches, said dielectric layer not completely filling said trenches.

6. The method of claim 5, wherein first and second stress rings comprise silicon nitride and said first stress rings are in internal compressive stress and said second stress rings are in internal tensile stress.

7. The method of claim 5, wherein first and second stress rings comprise silicon nitride and said first stress rings are in internal tensile stress and said second stress rings are in internal compressive stress.

8. The method of claim 1, wherein:
   (d) includes for each integrated circuit chip of said array of integrated circuit chips, forming a metal wire in a dielectric layer of each wiring level of said set of wiring levels, said wire extending in a continuous ring parallel and proximate to said perimeter of said integrated circuit chip, a wire of a subsequently formed wiring level stacked directly over and contacting a wire of a previously formed wiring level to form a guard ring;
   after (d), each integrated circuit chip of said array of integrated circuit chips including a respective guard ring comprising a stack of wires; and
   after (e), each individual integrated circuit chip including a respective guard ring, respective second stress rings intervening between respective guard rings and respective perimeters of each individual integrated circuit chip.

9. The method of claim 8, wherein:
   (d) includes forming an additional metal wire in said dielectric layer of each wiring level of said set of wiring levels, each respective additional wire extending in a continuous ring parallel and proximate to said perimeter of said integrated circuit chip, an additional wire of a subsequently formed wiring level stacked directly over and contacting an additional wire of a previously formed wiring level to form an additional guard ring;
   after (c), each integrated circuit chip of said array of integrated circuit chips including a respective additional guard ring comprising a stack of additional wires; and
   after (e), each individual integrated circuit chip including a respective additional guard ring, respective guard rings intervening between corresponding and respective additional guard rings respective second stress rings.

10. The method of claim 1, wherein said substrate is a silicon on insulator substrate comprising a silicon layer on a buried oxide layer; and further including before (a) forming a dielectric filled trench in said silicon layer, said dielectric filled trench extending from a top surface of said silicon layer to a top surface of said buried oxide layer, said gaps formed directly over respective dielectric filled trenches of each integrated circuit chip of said array of integrated circuit chips.

11. An integrated circuit chip, comprising:
   a continuous first stress ring proximate to a perimeter of said integrated circuit chip, respective edges of said first stress ring parallel to respective edges of said integrated circuit chip;
   a continuous second stress ring between said first stress ring and said perimeter of said integrated circuit chip, respective edges said second stress ring parallel to respective edges of said integrated circuit chip, said first and second stress rings having opposite internal stresses;
   a continuous gap between said first stress ring and said second stress ring; and
   a set of wiring levels from a first wiring level to a last wiring level on said substrate.

12. The integrated circuit chip of claim 11, further including:
   a hardmask ring, said hardmask ring on a top surface of said first stress ring and coextensive with said first stress ring; and
   said second stress ring overlapping a perimeter of said first stress ring.

13. The integrated circuit chip of claim 12, wherein each respective gap comprises a continuous seam along an interface between said first stress ring and said second stress ring.

14. The integrated circuit chip of claim 12, wherein said first and second stress rings comprise silicon nitride and said first stress ring is in internal compressive stress and said second stress ring is in internal tensile stress.

15. The integrated circuit chip of claim 11, further including:
   a hardmask ring, said hardmask ring on a top surface of said first stress ring and coextensive with said first stress ring;
   said second stress ring separated from said first stress ring by a continuous trench; and
   a dielectric layer over said first and second stress rings and said trench, said dielectric layer not completely filling said trench.

16. The integrated circuit chip of claim 15, wherein first and second stress rings comprise silicon nitride and said first stress ring is in internal compressive stress and said second stress ring is in internal tensile stress.

17. The integrated circuit chip of claim 15, wherein first and second stress rings comprise silicon nitride and said first stress ring is in internal tensile stress and said second stress ring is in internal compressive stress.

18. The integrated circuit chip of claim 11, further including:
   a guard ring comprising a metal wire in a dielectric layer of each wiring level of said set of wiring levels, said wire extending in a continuous ring parallel and proximate to said perimeter of said integrated circuit chip, said wires in adjacent wiring levels stacked directly over and contacting each other, said second stress ring intervening between said guard ring and said perimeter of said integrated circuit chip.

19. The integrated circuit chip of claim 18, further including:
   an additional guard ring comprising an additional metal wire in said dielectric layer of each wiring level of said set of wiring levels, said additional wire extending in a continuous ring parallel and proximate to said perimeter of said integrated circuit chip, said additional wires of adjacent wiring levels stacked directly over and contacting each other, said guard ring intervening between said additional guard ring and said perimeter of said integrated circuit chip.

20. The integrated circuit chip of claim 11, wherein said substrate is a silicon on insulator substrate comprising a silicon layer on a buried oxide layer; and further including a dielectric filled trench in said silicon layer, said dielectric filled trench extending from a top surface of said silicon layer to a top surface of said buried oxide layer, said gaps formed directly over said dielectric filled trench.

* * * * *